(12) United States Patent
Kerber et al.

(10) Patent No.: US 9,502,408 B2
(45) Date of Patent: Nov. 22, 2016

(54) FINFET DEVICE INCLUDING FINS HAVING A SMALLER THICKNESS IN A CHANNEL REGION, AND A METHOD OF MANUFACTURING SAME

(71) Applicant: GLOBALFOUNDRIES INC., Grand Cayman (KY)

(72) Inventors: Pranita Kerber, Mount Kisco, NY (US); Qiqing C. Ouyang, Yorktown Heights, NY (US); Alexander Reznicek, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/079,733

(22) Filed: Nov. 14, 2013

(65) Prior Publication Data
US 2015/0129982 A1 May 14, 2015

(51) Int. Cl.
*H01L 21/8234* (2006.01)
*H01L 27/088* (2006.01)

(52) U.S. Cl.
CPC ... *H01L 27/0886* (2013.01); *H01L 21/823431* (2013.01)

(58) Field of Classification Search
CPC .............. H01L 29/66545; H01L 29/78; H01L 29/1054; H01L 29/165; H01L 21/823431; H01L 21/823821; H01L 21/845; H01L 27/0924; H01L 27/1211; H01L 29/7831; H01L 29/785
See application file for complete search history.

(56) References Cited

U.S. PATENT DOCUMENTS

| 6,812,119 | B1 | 11/2004 | Ahmed et al. |
| 7,087,471 | B2 | 8/2006 | Beintner |
| 7,115,947 | B2 | 10/2006 | Clark, Jr. et al. |
| 7,763,531 | B2 | 7/2010 | Abadeer et al. |
| 8,324,036 | B2 | 12/2012 | Cheng et al. |
| 8,895,395 | B1* | 11/2014 | Kerber et al. ............... 438/275 |
| 2008/0277745 | A1* | 11/2008 | Hsu et al. .................... 257/412 |
| 2009/0302412 | A1* | 12/2009 | Cheng et al. ................ 257/506 |
| 2011/0117679 | A1* | 5/2011 | Lee et al. ......................... 438/5 |
| 2012/0187486 | A1* | 7/2012 | Goto et al. ................... 257/347 |
| 2012/0326232 | A1* | 12/2012 | Cheng ............... H01L 29/66772 257/347 |
| 2013/0093026 | A1 | 4/2013 | Wann et al. |
| 2013/0187229 | A1* | 7/2013 | Cheng .................. H01L 29/772 257/347 |
| 2013/0248999 | A1* | 9/2013 | Glass et al. .................. 257/335 |

(Continued)

*Primary Examiner* — Jarrett Stark
*Assistant Examiner* — Bitew Dinke
(74) *Attorney, Agent, or Firm* — Scully Scott Murphy and Presser; Frank Digiglio

(57) ABSTRACT

A method for manufacturing a fin field-effect transistor (FinFET) device, comprises forming a plurality of fins on a substrate to a first thickness, forming a sacrificial gate stack on portions of the fins, forming source drain junctions using ion implantation, forming a dielectric layer on the substrate, removing the sacrificial gate stack to expose the portions of the fins, thinning the exposed portions of the fins to a second thickness less than the first thickness, and forming a gate stack on the thinned exposed portions of the fins to replace the removed sacrificial gate stack.

10 Claims, 11 Drawing Sheets

(56) References Cited

U.S. PATENT DOCUMENTS

| | | | |
|---|---|---|---|
| 2013/0270628 A1* | 10/2013 | Huang | H01L 29/0847 257/329 |
| 2013/0292777 A1* | 11/2013 | Liaw | 257/369 |
| 2013/0307034 A1* | 11/2013 | Yin et al. | 257/288 |
| 2014/0001520 A1* | 1/2014 | Glass et al. | 257/288 |
| 2014/0027816 A1* | 1/2014 | Cea et al. | 257/192 |
| 2014/0070328 A1* | 3/2014 | Goto et al. | 257/401 |
| 2014/0084351 A1* | 3/2014 | Huang et al. | 257/288 |
| 2014/0084383 A1* | 3/2014 | Cai et al. | 257/401 |
| 2014/0097496 A1* | 4/2014 | Hu et al. | 257/368 |
| 2014/0113420 A1* | 4/2014 | Sargunas et al. | 438/231 |
| 2014/0134818 A1* | 5/2014 | Cheng et al. | 438/300 |
| 2014/0145242 A1* | 5/2014 | Huang et al. | 257/192 |
| 2014/0151761 A1* | 6/2014 | Hsieh et al. | 257/288 |
| 2014/0179077 A1* | 6/2014 | Chen et al. | 438/283 |
| 2014/0203334 A1* | 7/2014 | Colinge et al. | 257/288 |
| 2014/0203370 A1* | 7/2014 | Maeda et al. | 257/365 |
| 2014/0239354 A1* | 8/2014 | Huang | H01L 29/66545 257/288 |
| 2014/0239404 A1* | 8/2014 | Huang et al. | 257/369 |
| 2014/0264493 A1* | 9/2014 | Cheng et al. | 257/288 |
| 2014/0264604 A1* | 9/2014 | Tsai et al. | 257/347 |
| 2014/0353735 A1* | 12/2014 | Basker et al. | 257/288 |
| 2015/0155370 A1* | 6/2015 | Tsai et al. | 438/283 |

* cited by examiner

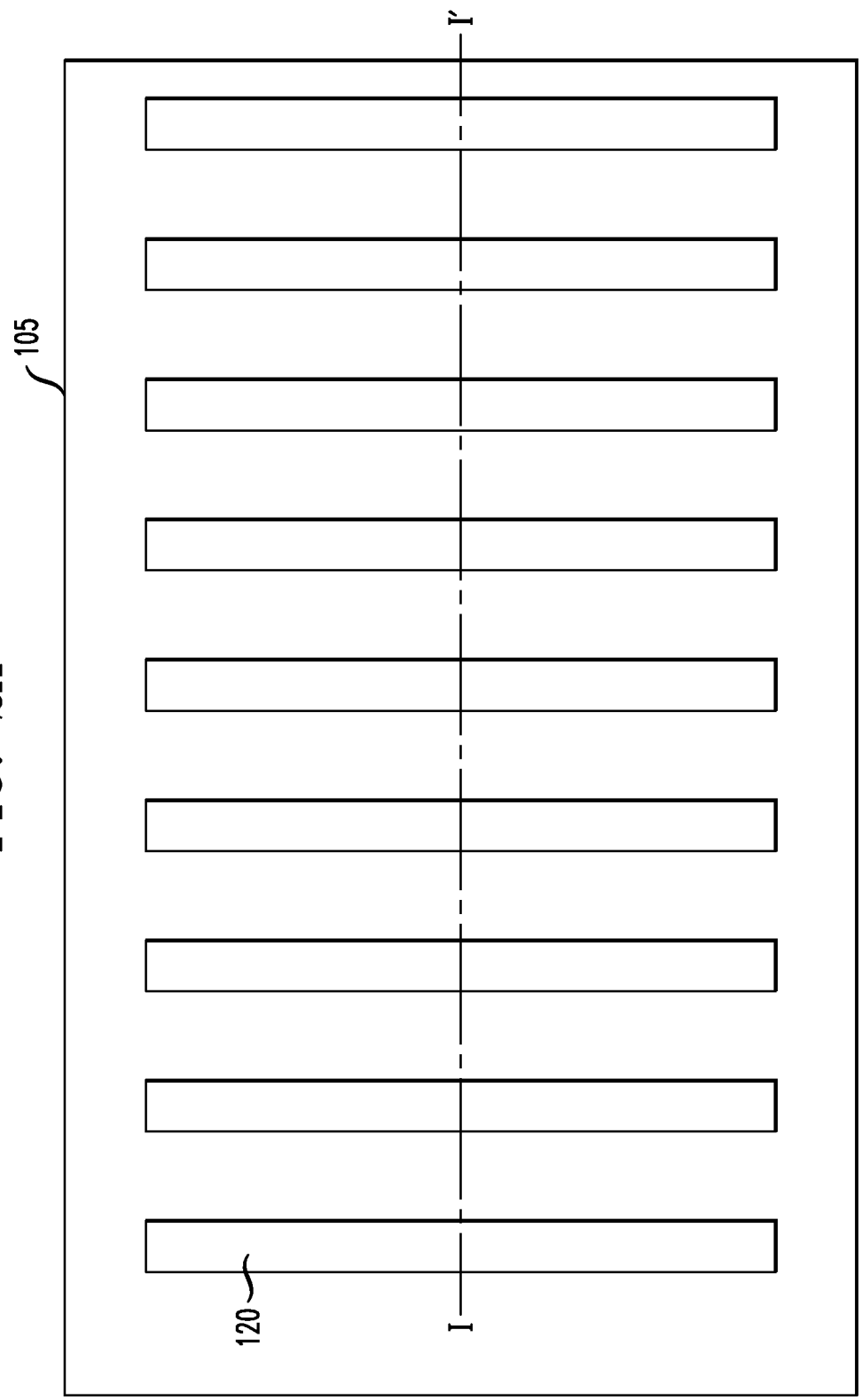

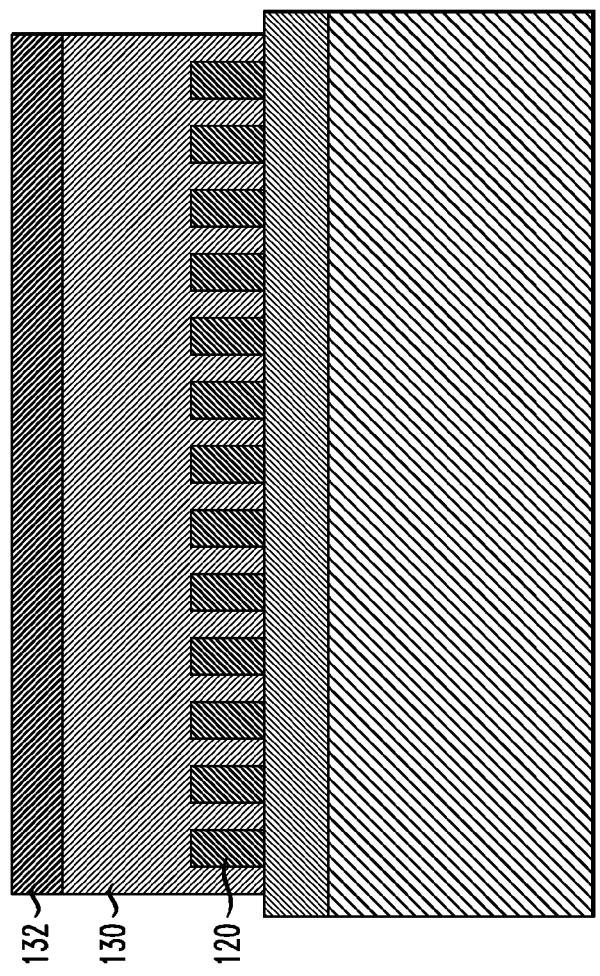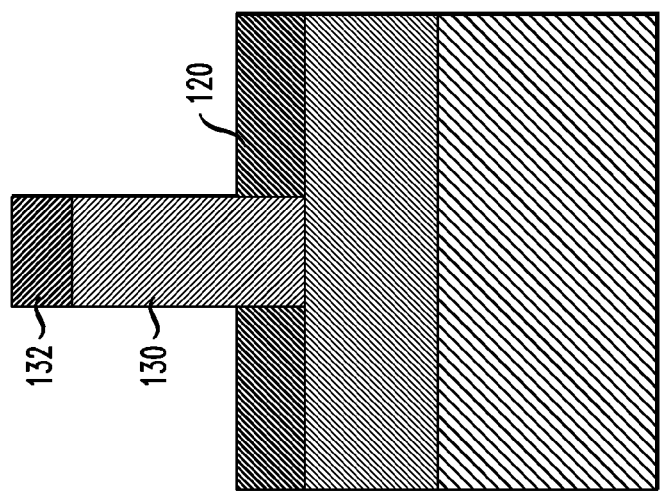

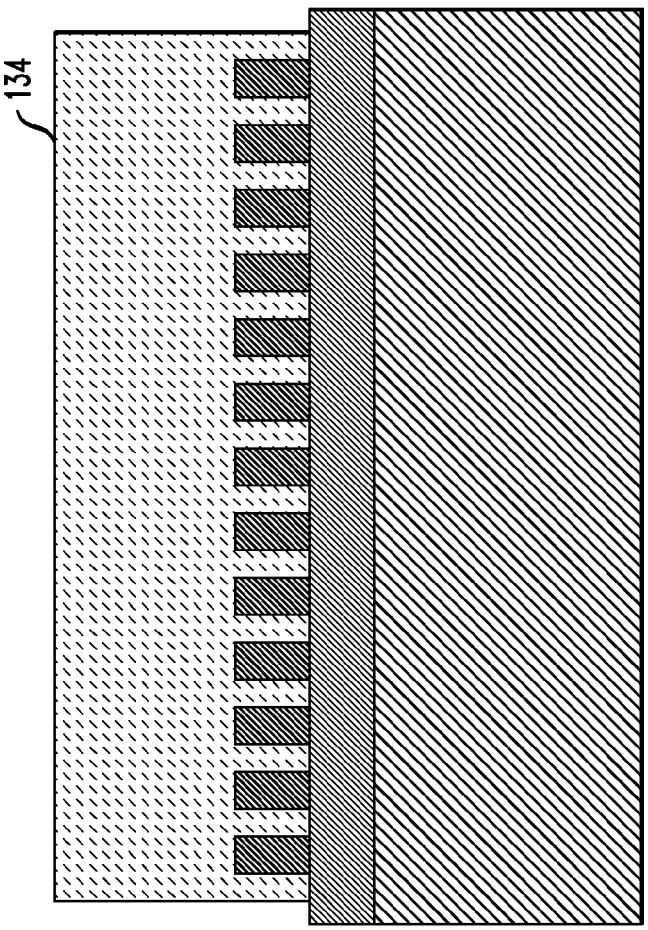
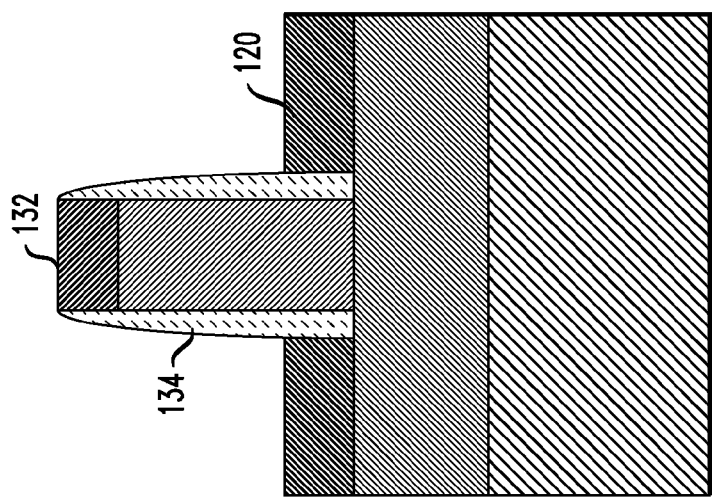
FIG. 4A
FIG. 4B

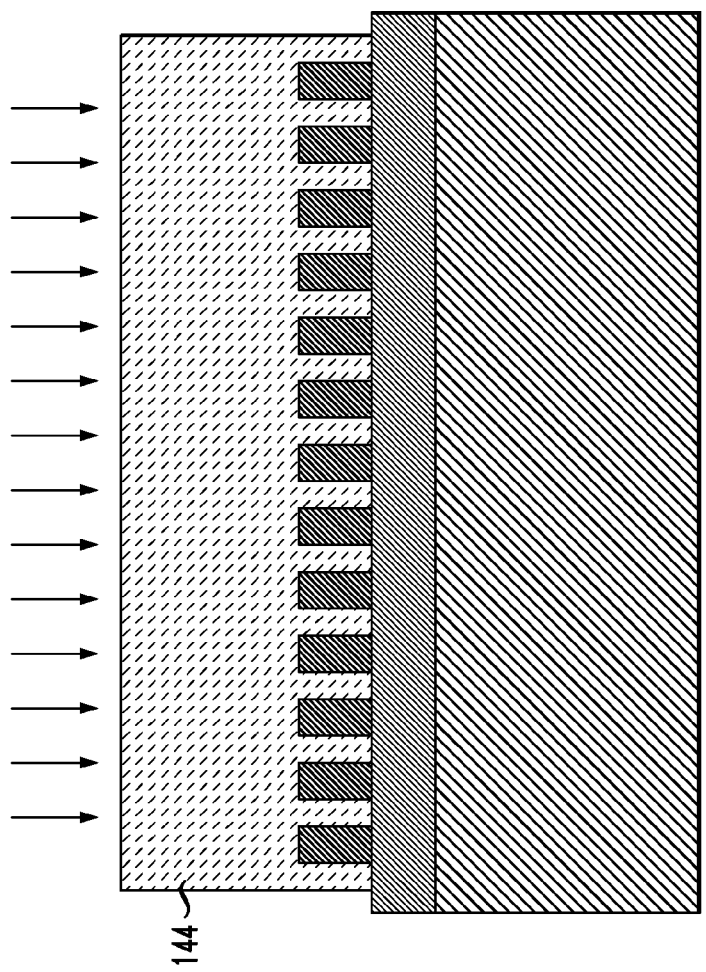
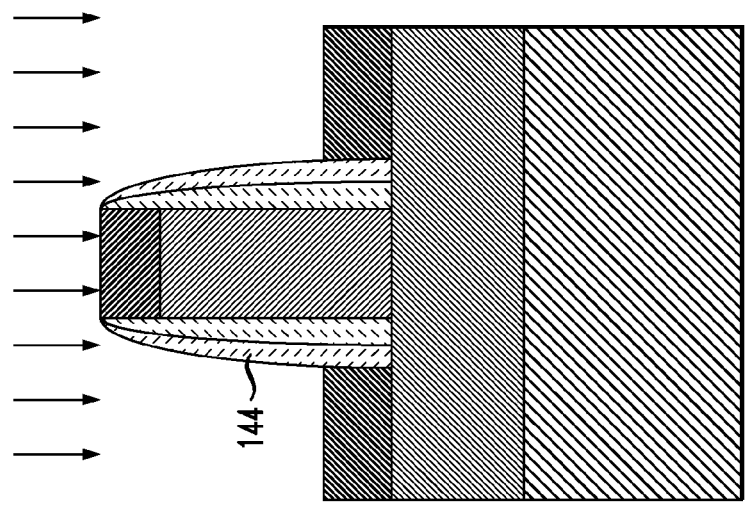

_US 9,502,408 B2_

FINFET DEVICE INCLUDING FINS HAVING A SMALLER THICKNESS IN A CHANNEL REGION, AND A METHOD OF MANUFACTURING SAME

TECHNICAL FIELD

The field generally relates to fin field-effect transistor (FinFET) devices and methods of manufacturing same and, in particular, to a FinFET device including fins having a smaller thickness in a channel region, and a method of manufacturing same.

BACKGROUND

For FinFET devices, the source drain regions are merged by growing epitaxy. However, the epitaxy growth process can be non-uniform, defective, and depend on loading effects. In addition, fin sidewall residues, fin shape, fin erosion, pitch walking, and other variations can undesirably impact epitaxy growth. For example, thickness and doping can vary as a function of fin number, which can have a serious impact for static random-access memory (SRAM) cells since the number of fins for the pass-gate (PG) NFET, pull-up (PU) PFET, and pull-down (PD) NFET are generally different. In addition, in SRAM devices, NFET and PFET regions are relatively close to each other, which can result in unwanted merging.

However, it has also been recognized that growing epitaxy to merge source drain regions beneficially reduces access resistance and facilitates formation (e.g., opening and filling) of subsequent conventional contact modules using, for example, contact area (CA) stud lithography.

Accordingly there is a need for a FinFET device and method of forming same that prevents or eliminates the noted difficulties with the epitaxy growth process while maintaining its benefits related to access resistance for the FinFET device.

SUMMARY

In general, exemplary embodiments of the invention include fin field-effect transistor (FinFET) devices and methods of manufacturing same and, in particular, to FinFET devices including fins having a smaller thickness in a channel region, and a method of manufacturing same.

According to an exemplary embodiment of the present invention, a method for manufacturing a fin field-effect transistor (FinFET) device, comprises forming a plurality of fins on a substrate to a first thickness, forming a sacrificial gate stack on portions of the fins, forming source drain junctions using ion implantation, forming a dielectric layer on the substrate, removing the sacrificial gate stack to expose the portions of the fins, thinning the exposed portions of the fins to a second thickness less than the first thickness, and forming a gate stack on the thinned exposed portions of the fins to replace the removed sacrificial gate stack.

According to an exemplary embodiment of the present invention, a fin field-effect transistor (FinFET) device, comprises a substrate having a channel and a source drain region, and a plurality of fins on the substrate in the channel and the source drain regions, wherein first portions of the fins in the source drain region have a first thickness, and second portions of the fins in the channel region have a second thickness less than the first thickness.

These and other exemplary embodiments of the invention will be described or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIGS. 2A and 2B are top and cross-sectional views, respectively, illustrating fin formation in a method of manufacturing a FinFET device, according to an exemplary embodiment of the present invention.

FIGS. 3A and 3B are cross-sectional views illustrating deposition and patterning of a sacrificial gate stack in a method of manufacturing a FinFET device, according to an exemplary embodiment of the invention.

FIGS. 4A and 4B are cross-sectional views illustrating deposition and patterning of a spacer region in a method of manufacturing a FinFET device, according to an exemplary embodiment of the present invention.

FIGS. 5A and 5B are cross-sectional views illustrating formation of source drain junctions using ion implantation in a method of manufacturing a FinFET device, according to an exemplary embodiment of the present invention.

DETAILED DESCRIPTION OF EXEMPLARY EMBODIMENTS

Figure 1A:
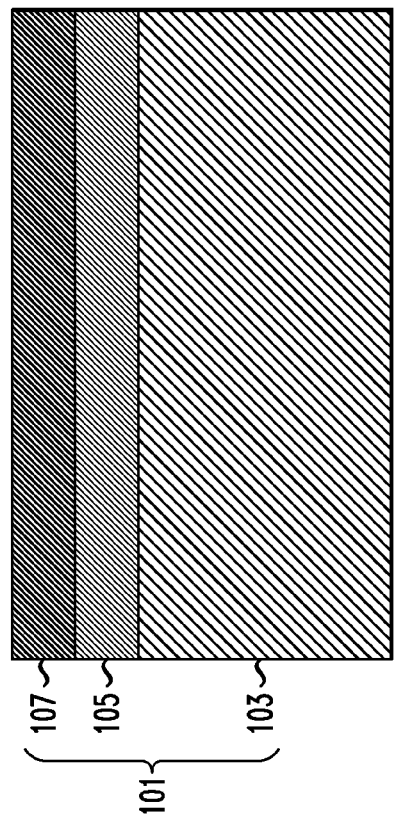
FIGS. 1A and 1B are cross-sectional views illustrating semiconductor substrates used in a method of manufacturing a FinFET device, according to an exemplary embodiment of the present invention.

Exemplary embodiments of the invention will now be discussed in further detail with regard to fin field-effect transistor (FinFET) devices and methods of manufacturing same and, in particular, to a FinFET device including fins having a smaller thickness in a channel region, and a method of manufacturing same. This invention may, however, be embodied in many different forms and should not be construed as limited to the embodiments set forth herein.

The embodiments of the present invention include a FinFET device and method of manufacturing same which starts with thicker fins than desired (e.g., thicker by about 10 nm), and performs fin thinning during a replacement metal gate (RMG) process after sacrificial gate removal. In accordance with an embodiment of the present invention, a method for manufacturing a FinFET device utilizes metal and dielectric last process flow, and the FinFET device includes contact area (CA) bars instead of CA holes due to unmerged fins in the source drain region.

In accordance with embodiments of the present invention, epitaxy growth process steps are removed along with associated thickness and doping non-uniformity caused by same, and doping is done by ion implantation alone. Embodiments of the present invention form at or about 100% thicker fins in the source drain region to promote lower resistance, while maintaining thinner fins in the channel region to improve electrostatics and gate control.

Embodiments of the present invention can achieve reduced access resistance without degradation of short-channel effects. In addition, reduction in silicide contact resistance possible, whereby silicide and contact bars can form on the fin sidewalls in the source drain region to increase contact area and lower the overall access resistance to the FinFET device.

It is to be understood that the various layers and/or regions shown in the accompanying drawings are not drawn to scale, and that one or more layers and/or regions of a type commonly used in FinFET devices may not be explicitly shown in a given drawing. This does not imply that the layers and/or regions not explicitly shown are omitted from the actual FinFET devices. Moreover, the same or similar reference numbers used throughout the drawings are used to denote the same or similar features, elements, or structures, and thus, a detailed explanation of the same or similar features, elements, or structures will not be repeated for each of the drawings.

The FinFET devices and methods for forming same in accordance with the embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the FinFET devices are contemplated embodiments of the invention. Given the teachings of the embodiments of the invention provided herein, one of ordinary skill in the art will be able to contemplate other implementations and applications of embodiments of the invention.

Figure 1B:
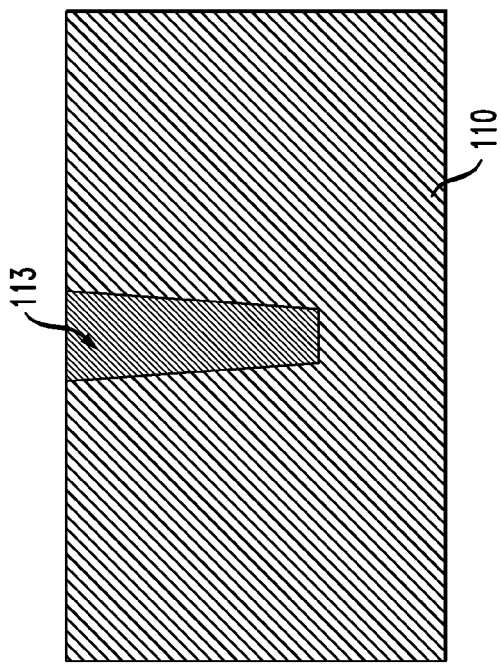

Referring to FIGS. 1A and 1B, a silicon-on-insulator (SOI) substrate 101 or a bulk substrate 110 can be used as the semiconductor substrate 100 of the FinFET device. The SOI substrate 101 includes a handle substrate 103, a buried insulating layer 105, such as, for example, a buried oxide or nitride layer, located on an upper surface of the handle substrate 103, and a semiconductor layer 107 located on an upper surface of the buried insulating layer 105. The handle substrate 103 and the semiconductor layer 107 may comprise the same or different semiconductor material including, but not limited to, Si, SiGe, SiC, SiGeC or other like semiconductor. In addition, multiple layers of the semiconductor materials can be used as the semiconductor material of the handle substrate and the semiconductor layer.

In accordance with another embodiment of the present invention, the substrate 100 is a bulk semiconductor substrate 110 omitting the buried insulating layer and having a semiconductor material including, but not limited to, Si, SiGe, SiC, SiGeC or other like semiconductor. Multiple layers of these semiconductor materials can also form the bulk semiconductor substrate 110.

If a bulk substrate 110 is used, device isolation using shallow trench isolation (STI) is performed. The isolation region 113 may be utilized to isolate differently doped regions on adjacent sides from one another (e.g., N to P or P to N) and/or isolate regions having different doping levels for different voltage threshold ($V_T$) devices.

According to an embodiment of the present invention, a well implantation step can be performed to create doped NFET and PFET devices with different voltage thresholds ($V_T$), and PFET devices may include a silicon germanium (SiGe) on insulator configuration. In addition, the fin channel material for PFET and NFET devices could be different.

Figure 2B:
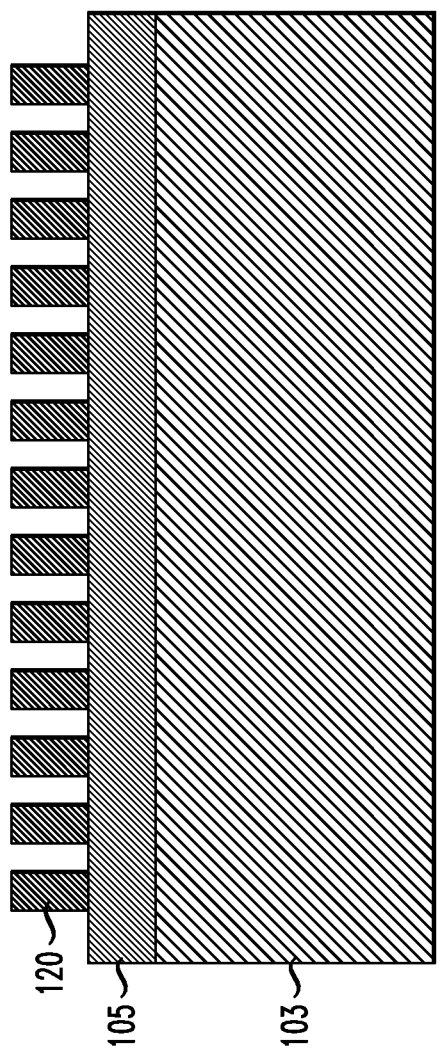

Referring to FIGS. 2A and 2B, which are top and cross-sectional views, respectively, illustrating fin formation in a method of manufacturing a FinFET device, according to an exemplary embodiment of the present invention, fins 120 are formed on substrate 100 by patterning the SOI layer 107 (or a top portion of the bulk substrate 110 depending on which type of substrate is used). Patterning is performed by a method known in the art, for example, sidewall image transfer and etching. Referring to FIG. 2A, the cross-section is taken along line I-I', perpendicular to the fins 120. The fins 120 in the channel region are formed intentionally thicker than desired. For example, for a gate length of 20 nm and channel fin-thickness of 10 nm, fins are generally 10 nm thick outside the channel region. According to an embodiment, the fins are formed at or about 100% thicker than a typical thickness required for good electrostatic and gate control for a given gate-length. As is explained further below, the fins are subsequently thinned down in the channel region during a replacement metal gate (RMG) process to a desired thickness (e.g., 10 nm). It is to be understood that the fin thicknesses are examples, and may vary based on pitch and other design constraints. According to an embodiment, the thicker fins are formed by using a mask with wider dimensions than would be used during a conventional fin definition process.

FIGS. 3A and 3B are cross-sectional views illustrating deposition and patterning of a sacrificial gate stack in a method of manufacturing a FinFET device, according to an exemplary embodiment of the invention. A sacrificial gate stack layer is deposited on the resulting structure from FIGS. 2A and 2B, and patterned to form sacrificial gate stack 130 around sides and on upper surfaces of designated portions of the fins 120 for the gate areas. According to an embodiment, the sacrificial gate stack 130 can include an interfacial oxide (or other dielectric) and polysilicon, SiGe or any other material that can be etched relatively easily during a replacement gate etch process, and a gate hardmask 132, for example a nitride, or any dielectric or combination of dielectric layers, is formed on the sacrificial gate stack 130. The cross-section in FIG. 3A is taken along a line parallel to the fins 120, and the cross-section in FIG. 3B is taken along a line perpendicular to the fins 120 and cutting through the sacrificial gate 130. Patterning of the sacrificial gate stack 130 including the hardmask can be performed using, for example, lithography and etching.

Referring to FIGS. 4A and 4B, which are cross-sectional views illustrating deposition and patterning of a spacer region in a method of manufacturing a FinFET device, according to an embodiment of the present invention, a spacer layer is also deposited on the resulting structure of FIGS. 3A-3B, and is patterned by, for example, an isotropic etching process, such as reactive ion etching (RIE), to form spacer pattern 134 along sides of the sacrificial gate stack and hardmask 130, 132. The spacer pattern 134 isolates the gate stack 130 from the source drain regions on either side of the gate stack 130. In accordance with an embodiment of the present invention, NFET and PFET portions of the device can have different spacer materials and different spacer thicknesses. The spacers can be formed from, for example, oxides, nitrides or a combination thereof The cross-section in FIG. 4A is taken along a line parallel to the fins 120, and the cross-section in FIG. 4B is taken along a line perpendicular to the fins 120.

As shown in FIG. 5A, an optional second spacer 144 can be formed on PFET and/or NFET regions of the device. A second spacer layer is deposited on the gate stacks 130 including the first spacers 134 and patterned by, for example, reactive ion etching (RIE) to form second spacer patterns 144 along sides of the first spacer patterns 134 on the gate stacks 130. Like the spacer patterns 134, the spacer patterns 144 isolate the gate stacks 130 from the source drain regions on either side of the gate stacks 130. The spacer patterns 134, 144 can include a dielectric insulating material such as, for example, silicon oxide, silicon nitride, silicon oxynitride, boron nitride, and/or silicon boron nitride. In accordance with an embodiment, the optional second spacer patterns 144 are formed prior to source drain implantation. An optional ion implantation step can also be performed after first spacer definition and before the second spacer definition.

FIGS. 5A and 5B are cross-sectional views illustrating formation of source drain junctions using ion implantation in a method of manufacturing a FinFET device, according to an embodiment of the present invention. The cross-section in FIG. 5A is taken along a line parallel to the fins 120, and the cross-section in FIG. 5B is taken along a line perpendicular to the fins 120. In accordance with an embodiment of the present invention, an extension implant is performed. According to embodiments of the present invention, the extension and source drain implantation can be, for example, a vertical or angled implant, and single or multiple and with same or different species. Ion implantation (as shown by the arrows) is performed by masking devices with different polarities and/or voltage thresholds ($V_T$). The dopants include, for example, boron, BF2, arsenic, and phosphorus. Dopant dosage levels for ion implantation include, for example, $5\times10^{13}$ to $5\times10^{15}/cm^2$.

In accordance with an embodiment of the present invention, a junction anneal step, such as rapid thermal annealing (RTA) or laser spike annealing (LSA), can follow the ion implantation step to activate the source drain dopants. After activation, a field oxide or inter-level dielectric layer 140 is deposited and planarized down to the gate hardmask 132.

Figure 6B:
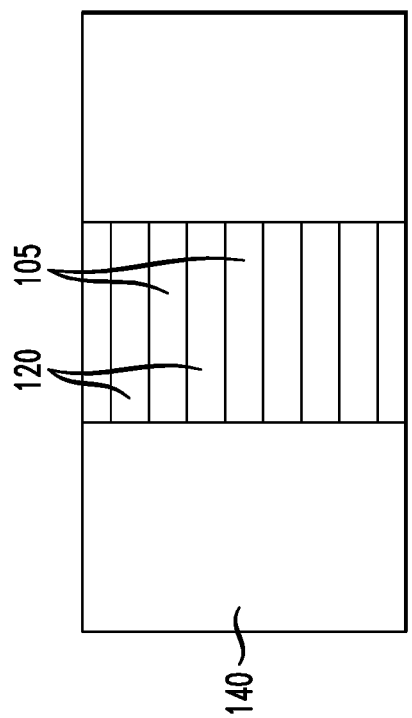
FIGS. 6A, 6B and 6C are two cross-sectional views and a top view, respectively, illustrating removal of a sacrificial gate and hardmask in a method of manufacturing a FinFET device, according to an exemplary embodiment of the invention.
Figure 6C:
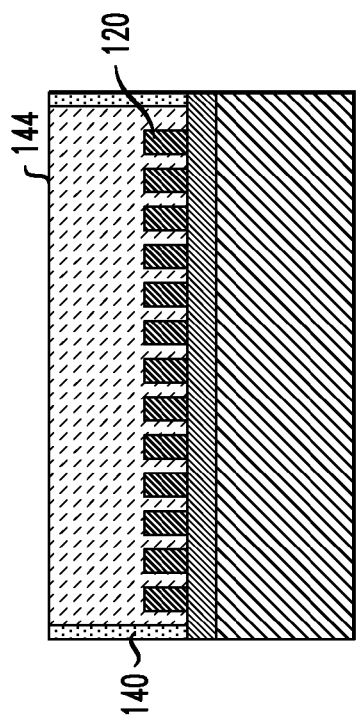
Figure 6A:
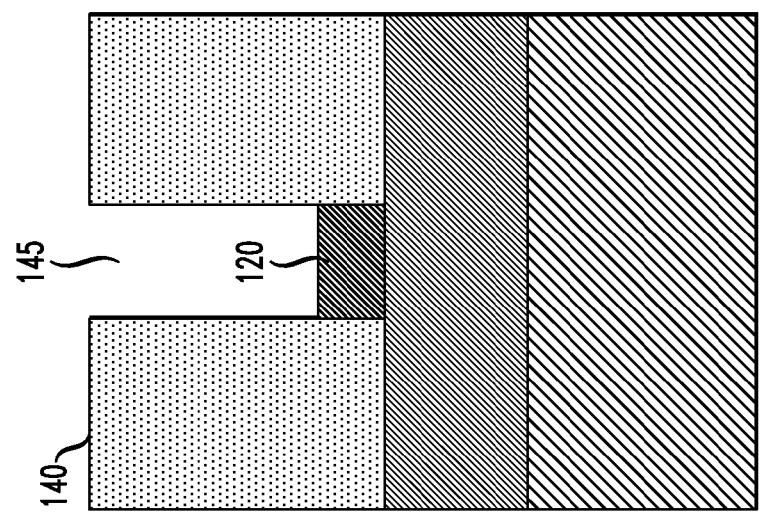

FIGS. 6A, 6B and 6C are two cross-sectional views and a top view, respectively, illustrating removal of the sacrificial gate and hardmask 130,132, in a method of manufacturing a FinFET device, according to an exemplary embodiment of the invention. FIG. 6A is a cross-section taken parallel to the fins, and FIG. 6B is a cross-section taken perpendicular to the fins. Referring to FIGS. 6A-6C, the sacrificial gate stack and gate hardmask 130 and 132 are removed by, for example, selective etching to expose the fins 120 and BOX layer 105 (in the case of an SOI substrate 101) in the channel region through opening 145. The inter-level dielectric 140 is formed around the gate stack 130 and gate hardmask 132 prior to selective etching. The spacer(s) 134, 144 and the source drain region are covered by the inter-level dielectric.

Figure 7B:
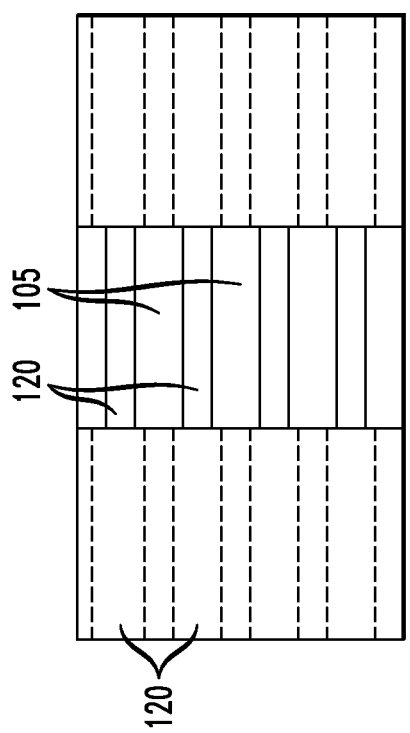
FIGS. 7A, 7B and 7C are two cross-sectional views and a top view, respectively, illustrating thinning of fins in a channel region, in a method of manufacturing a FinFET device, according to an exemplary embodiment of the invention.
Figure 7C:
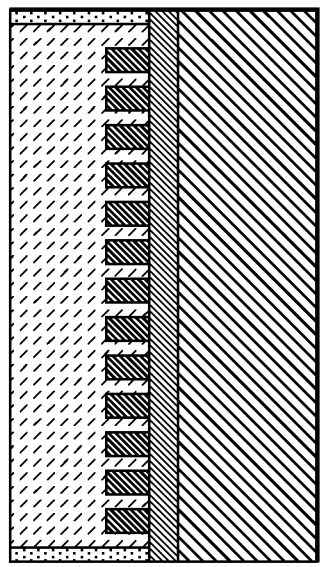
Figure 7A:
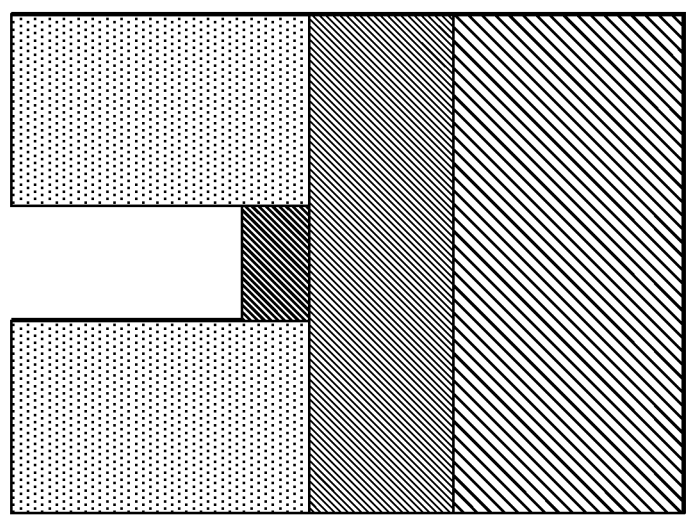
Figure 7D:
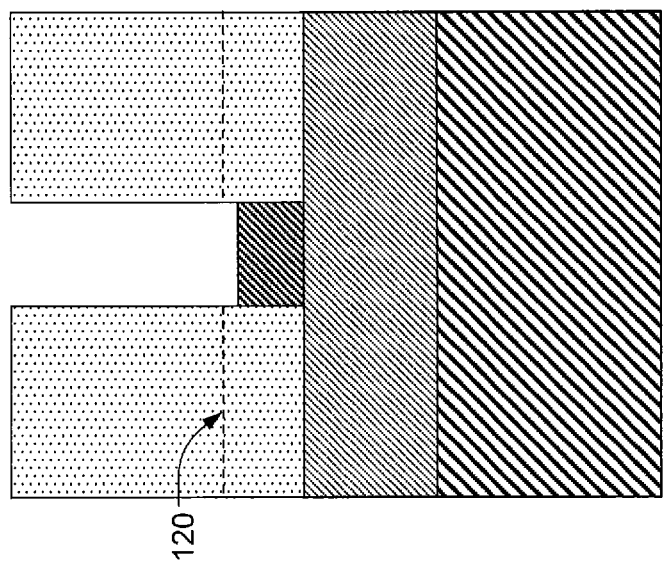
FIG. 7D is a cross-sectional view illustrating reduction of fins in a channel region, in a method of manufacturing a FinFET device, according to an exemplary embodiment of the invention.

FIGS. 7A, 7B and 7C are two cross-sectional views and a top view, respectively, illustrating thinning of the fins 120 in the channel region, in a method of manufacturing a FinFET device, according to an exemplary embodiment of the invention. FIG. 7A is a cross-section taken parallel to the fins, and FIG. 7B is a cross-section taken perpendicular to the fins. In a timed etch process using, for example, hydrochloric acid (HCl), the fins 120 etched to a smaller thickness, for example, to about a 50% smaller thickness. In an illustrative example, 20 nm fins can be etched down to about 8 to about 10 nm in the channel region, removing about 5 nm to about 6 nm from opposite sides of the fins. As the sidewalls of the fin are etched, the tops of the fins will also be etched and will result in a reduction of fin height in the exposed channel region. According to an embodiment, this loss in the fin-height is accounted for during the fin patterning step, whereby taller fins are formed to compensate for loss of fin height during etching. The resulting structure may have taller fin height in the regions protected by the inter-level dielectric and shorter fin height in the channel region. As a result, according to an embodiment, the thickness of the fins in the channel region will be about 50% less than the thickness of the fins in the source drain region. The ratio of the thicknesses of the fins in the channel region to the fins in the source drain region may vary. According to an embodiment, a fin thickness should be large enough to permit removal of about 3 nm to about 8 nm on opposite sides of the fins (i.e., a total thickness reduction of about 6 nm to about 16 nm) during the thinning process. The etchant (e.g., HCl) has high etch selectivity to the silicon (and other semiconductor materials such as SiGe, Ge, or Si:C) with respect to other dielectric materials such as oxide, nitride, oxynitride so that etching of the inter-level dielectric 140 and the spacer(s) 134, 144 is prevented or kept to a minimum level. Other etchants that may be used include, for example, plasma etchants: $CF_4$, $SF_6$, $NF_3$, $Cl_2$, $CCl_2F_2$, wet etchants: Tetramethylammonium hydroxide (TMAH) and a mixture of nitric and hydrochloric acid.

Figure 8B:
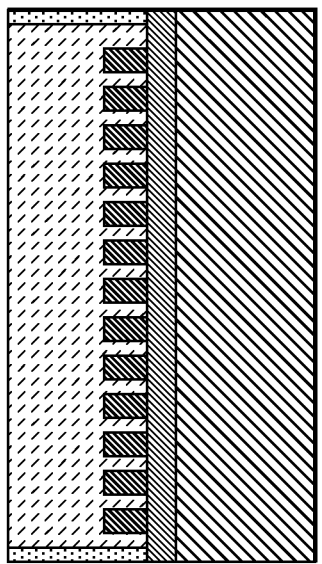
FIGS. 8A, 8B and 8C are two cross-sectional views and a top view, respectively, illustrating deposition of an interfacial gate dielectric layer followed by deposition of a gate layer, in a method of manufacturing a FinFET device, according to an exemplary embodiment of the invention.
Figure 8C:
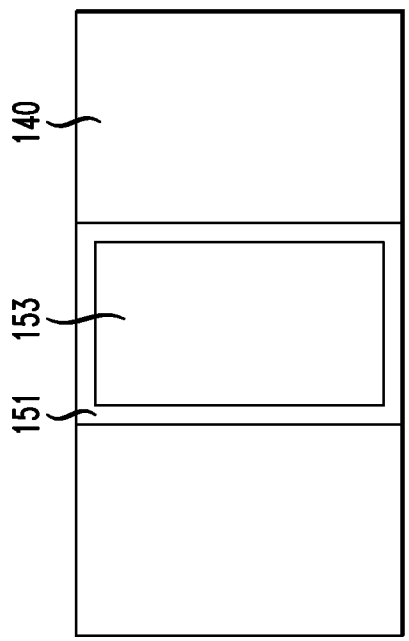
Figure 8A:
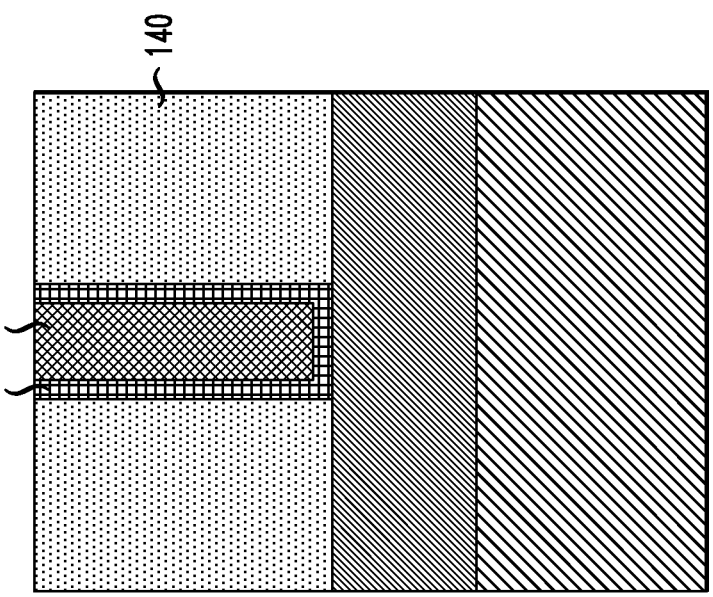

FIGS. 8A, 8B and 8C are two cross-sectional views and a top view, respectively, illustrating deposition of a gate stack 150 comprising an interfacial gate dielectric layer 151 and a metal gate layer 153, in a method of manufacturing a FinFET device, according to an exemplary embodiment of the invention. FIG. 8A is a cross-section taken parallel to the fins, and FIG. 8B is a cross-section taken perpendicular to the fins. The gate dielectric 151 is deposited on sides of the opening 145 to interface between the inter-level dielectric 140 and the gate layer 153. The gate metal 153 is deposited on the gate dielectric layer 151. Then, the layers 151 and 153 are planarized down to the inter-level dielectric 140 using, for example, chemical mechanical planarization (CMP).

The gate dielectric material portion 151 can be, for example, silicon oxide, or a high-k material including, but not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g. silicon oxide, and a high-k gate dielectric can be formed.

The gate dielectric material portion 151 can be formed by any deposition technique including, for example, chemical vapor deposition (CVD), plasma enhanced chemical vapor deposition (PECVD), physical vapor deposition (PVD), sputtering, and atomic layer deposition.

After providing the gate dielectric material portion 151, the gate metal 153 can be formed atop the gate dielectric material portion and filling the remaining space of the cavity 145. The gate metal 153 can include any conductive metal material including, for example, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. The gate metal 153 can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes. When a metal silicide is formed, a conventional silicidation process is employed.

Figure 9B:
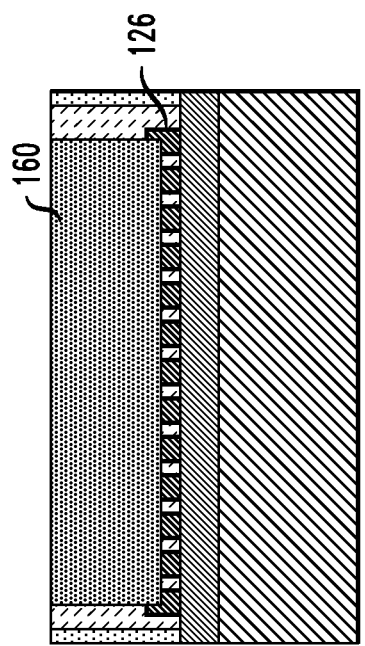
FIGS. 9A, 9B and 9C are two cross-sectional views and a top view, respectively, illustrating formation of contact bars, in a method of manufacturing a FinFET device, according to an exemplary embodiment of the invention.
Figure 9C:
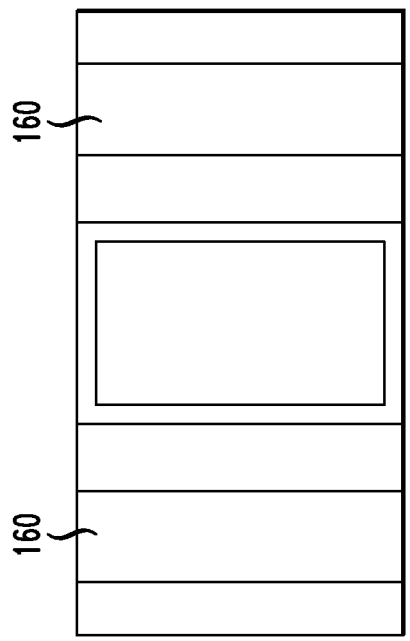
Figure 9A:
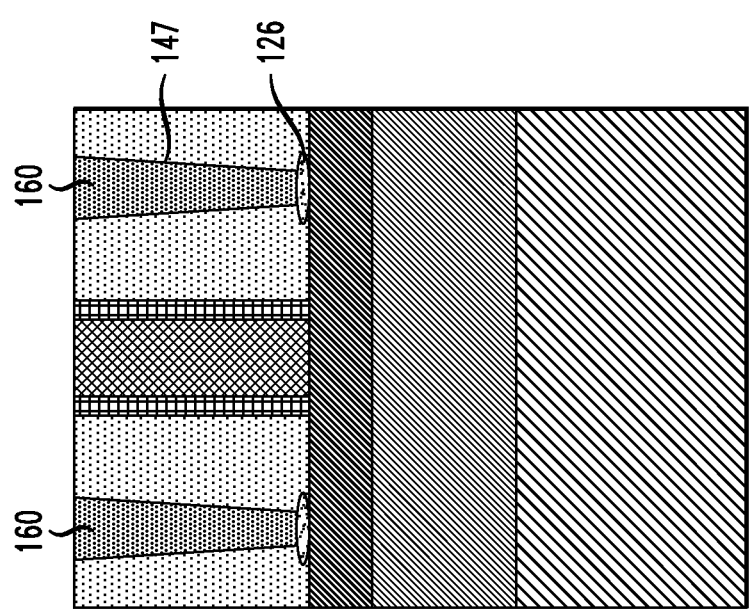

FIGS. 9A, 9B and 9C are two cross-sectional views and a top view, respectively, illustrating formation of contact bars 160, in a method of manufacturing a FinFET device, according to an exemplary embodiment of the invention. FIG. 9A is a cross-section taken parallel to the fins, and FIG. 9B is a cross-section taken perpendicular to the fins. In accordance with an embodiment of the present invention, while masking one of the FET regions (e.g., the PFET region), the RMG process in the other FET region (e.g., the NFET region) is completed. Contact holes 147 are etched in the inter-level dielectric 140 and filled with a conductive material, such as metal, including, but not limited to, titanium, copper, to form contact bars 160 extending across multiple fins 120. In accordance with an embodiment, annealing at a low temperature (e.g.,<500° C.) can be performed to form a silicide layer 126 around the fins 120.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a fin field-effect transistor (FinFET) device, the method comprising:
   forming a plurality of fins on a substrate by patterning a semiconductor layer to a first thickness and a first height;
   forming a sacrificial gate stack on portions of the fins in a channel region of the FinFET device;
   forming source drain junctions in a source drain region of the FinFET device using ion implantation;
   forming a dielectric layer on the substrate;
   removing the sacrificial gate stack to expose the portions of the fins in the channel region, wherein the dielectric layer covers remaining portions of the fins in the source drain region;
   thinning the exposed portions of the fins to a second thickness less than the first thickness, and reducing the exposed portions of the fins to a second height less than the first height, wherein the thinning removes about 50% to about 60% of the first thickness, and wherein each of a resulting height and thickness of the remaining portions of the fins in the source drain region is greater than each of a resulting height and thickness of the portions of the fins in the channel region such that an entirety of the patterned semiconductor layer comprising the fins in the source drain region are at the first height and the first thickness achieved prior to the thinning and reducing;
   forming a gate stack on the thinned and reduced exposed portions of the fins to replace the removed sacrificial gate stack;
   etching a plurality of contact holes in the dielectric layer; and
   filling the contact holes with a conductive material to form contact bars extending across the plurality of fins;
   wherein the contact bars couple respective portions of the plurality of fins together without epitaxial regions to merge adjacent fins.

2. The method according to claim 1, further comprising forming at least one spacer on the sacrificial gate stack.

3. The method according to claim 1, wherein the sacrificial gate stack is not formed on the remaining portions of the fins and the remaining portions of the fins remain at the first thickness.

4. The method according to claim 1, wherein the thinning of the exposed portions of the fins is performed by etching the exposed portions of the fins to remove about 50% to about 60% of the first thickness.

5. The method according to claim 4, wherein the etching of the exposed portions of the fins is performed with an etchant having a high selectivity with respect to a material of the fins.

6. The method according to claim 1, wherein removing the sacrificial gate stack leaves a cavity in the dielectric layer.

7. The method according to claim 1, wherein the second thickness is equal to about 50% of the first thickness.

8. The method according to claim 1, wherein the method prevents etching of the remaining portions of the fins in the source drain region to maintain the resulting height and thickness of the remaining portions of the fins in the source drain region at the first height and the first thickness.

9. A method for manufacturing a fin field-effect transistor (FinFET) device, the method comprising:
   forming a plurality of fins on a substrate to a first thickness and a first height;
   forming a sacrificial gate stack on portions of the fins in a channel region of the FinFET device;
   forming source drain junctions in a source drain region of the FinFET device using ion implantation;
   forming a dielectric layer on the substrate;
   removing the sacrificial gate stack to expose the portions of the fins in the channel region, wherein the dielectric layer covers remaining portions of the fins in the source drain region;
   thinning the exposed portions of the fins to a second thickness less than the first thickness, and reducing the exposed portions of the fins to a second height less than the first height, wherein the thinning removes about 50% to about 60% of the first thickness, and wherein each of a resulting height and thickness of the remaining portions of the fins in the source drain region is greater than each of a resulting height and thickness of the portions of the fins in the channel region;
   forming a gate stack on the thinned and reduced exposed portions of the fins to replace the removed sacrificial gate stack;
   etching a plurality of contact holes in the dielectric layer; and
   filling the contact holes with a conductive material to form contact bars extending across the plurality of fins;
   wherein the contact bars couple respective portions of the plurality of fins together without epitaxial regions to merge adjacent fins.

10. A method for manufacturing a fin field-effect transistor (FinFET) device, the method comprising:
- forming a plurality of fins on a substrate to a first thickness and a first height;
- forming a sacrificial gate stack on portions of the fins in a channel region of the FinFET device;
- forming source drain junctions in a source drain region of the FinFET device using ion implantation;
- forming a dielectric layer on the substrate;
- removing the sacrificial gate stack to expose the portions of the fins in the channel region, wherein the dielectric layer covers remaining portions of the fins in the source drain region;
- thinning the exposed portions of the fins to a second thickness less than the first thickness, and reducing the exposed portions of the fins to a second height less than the first height, wherein the thinning removes about 50% to about 60% of the first thickness, and wherein each of a resulting height and thickness of the remaining portions of the fins in the source drain region is greater than each of a resulting height and thickness of the portions of the fins in the channel region; and
- forming a gate stack on the thinned and reduced exposed portions of the fins to replace the removed sacrificial gate stack.

* * * * *